United States Patent
Santos et al.

(10) Patent No.: US 8,716,845 B2
(45) Date of Patent: May 6, 2014

(54) LEAD FRAME STRIP FOR REDUCED MOLD STICKING DURING DEGATING

(75) Inventors: Norbert Joson Santos, Baguio (PH);
Edgar Dorotayo Balidoy, Benguet (PH); Anthony Steven Dominisac Panagan, Baguio (PH); Jerry Gomez Cayabyab, Baguio (PH); Ferdinand S. Signey, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 606 days.

(21) Appl. No.: 13/087,475

(22) Filed: Apr. 15, 2011

(65) Prior Publication Data

US 2012/0261806 A1 Oct. 18, 2012

(51) Int. Cl.
*H01L 23/495* (2006.01)

(52) U.S. Cl.
USPC ............ 257/666; 257/669; 438/123; 438/124

(58) Field of Classification Search
USPC ........... 257/666, 669, 676; 438/111, 123, 124
See application file for complete search history.

(56) References Cited

U.S. PATENT DOCUMENTS

| | | | |
|---|---|---|---|
| 5,069,832 A | | 12/1991 | Okumura et al. |
| 6,013,947 A | * | 1/2000 | Lim ............................... 257/685 |
| 7,264,456 B2 | | 9/2007 | Williams et al. |
| 8,587,099 B1 | * | 11/2013 | Abbott .......................... 257/666 |
| 2001/0049159 A1 | * | 12/2001 | Hsu et al. ...................... 438/112 |
| 2003/0147185 A1 | | 8/2003 | Regala, IV et al. |
| 2008/0296746 A1 | * | 12/2008 | Saiki et al. .................... 257/669 |
| 2011/0233744 A1 | * | 9/2011 | Chow et al. ................... 257/669 |

FOREIGN PATENT DOCUMENTS

| | | |
|---|---|---|
| JP | 05315514 A | 11/1993 |
| JP | 08222593 A | 8/1996 |
| WO | PCT/US2012/033818 | 4/2012 |

* cited by examiner

*Primary Examiner* — S. V. Clark
(74) *Attorney, Agent, or Firm* — Steven A. Shaw; Wade James Brady, III; Frederick J. Telecky, Jr.

(57) ABSTRACT

A lead frame strip includes an array of sites arranged in at least one row connected to two exterior side rails which traverse the lead frame strip on two opposite sides. Each of the sites is further connected to the two exterior side rails by subrails which extend between the two exterior side rails. Interior side rails extend between the subrails having a length dimension oriented along a first direction. The interior side rails include at least one punch degating aperture having an aperture length oriented along the first direction, wherein a total of the aperture length along the interior side rails is greater than or equal to the die pad length.

15 Claims, 6 Drawing Sheets

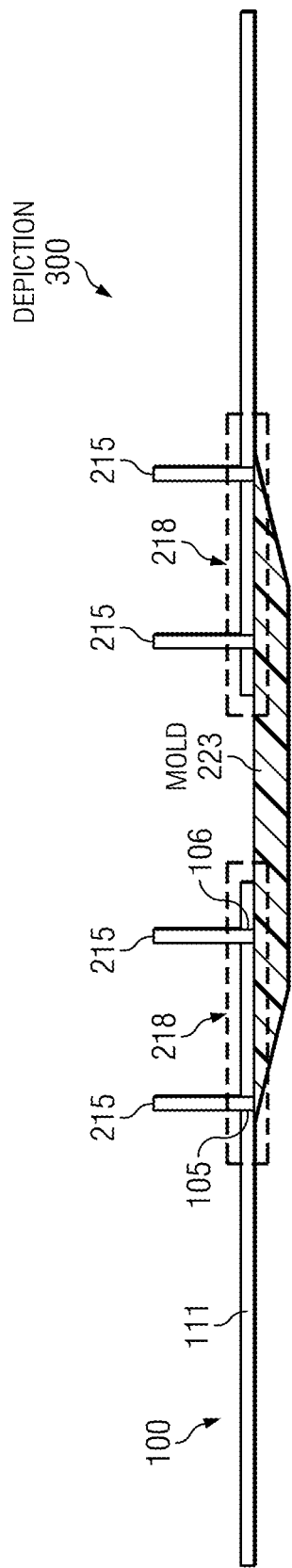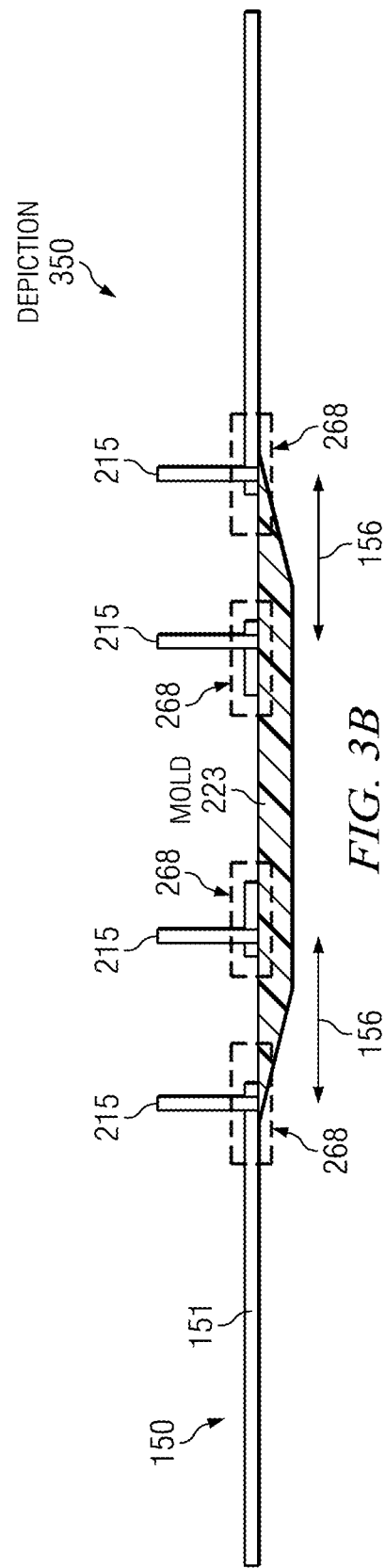

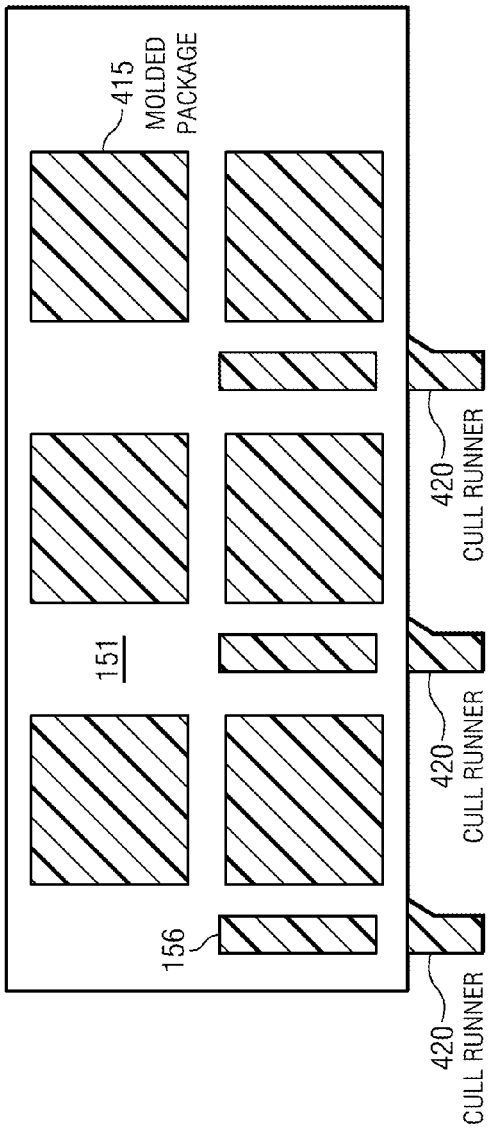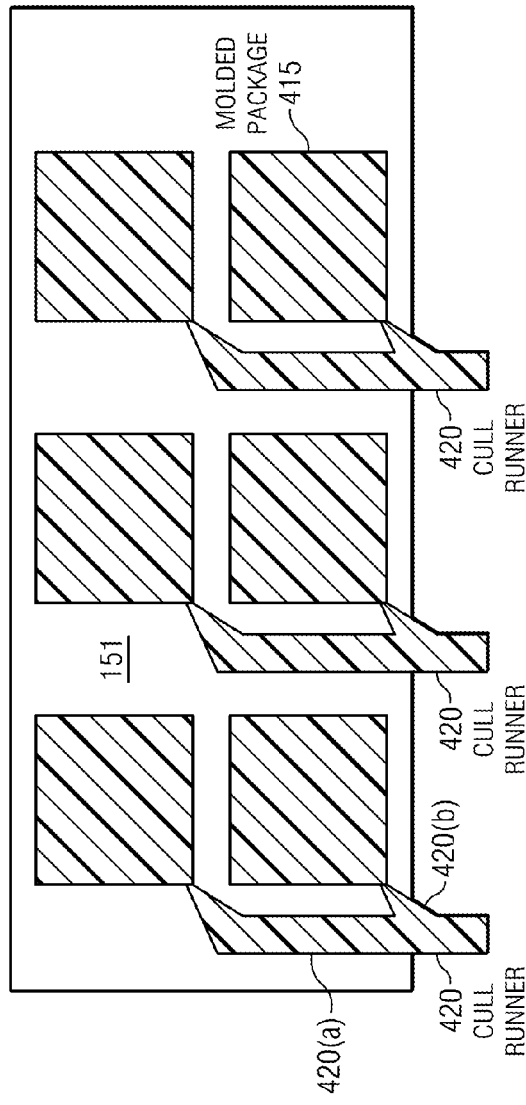

LEAD FRAME STRIP FOR REDUCED MOLD STICKING DURING DEGATING

FIELD

Disclosed embodiments relate to degating for removing excess mold compound from a semiconductor integrated circuit (IC) device after encapsulation, and more particularly to lead frame strip designs that reduce mold compound adhesion to the lead frame in the degating regions.

BACKGROUND

In an injection molding assembly process for fabricating packaged plastic electronic devices, IC devices are encapsulated with a molding compound (e.g., an epoxy resin) in order to provide protection for the packaged device from the external environment. This encapsulation process is also called a molding process.

The encapsulation process generally involves placing IC devices, typically positioned on a sites on a substrate strip such as die pads of a leadframe strip, in one or more cavities of a mold. Liquid molding compound is then forced through chambers of a mold, forming culls, which subsequently flows through a series of mold runners and subrunners. From the subrunners, the mold compound flows through a series of gates and enters the mold cavities, thus forming encapsulant bodies on the IC devices. Excess encapsulant, a byproduct of the encapsulation process, generally referred to as cull runners, are ejected from the runners and subrunners while still connected to the gates of the encapsulant bodies. The cull runners can be removed by a process called degating with the aid of an apparatus called a "degater" or "degater assembly" that includes degate punchers.

The purpose of degating is to remove the cull runners from the encapsulant bodies that protect the IC device. In the case the substrate comprises a lead frame strip, degating may comprise using a first and a second degate puncher using pressure provide by a hydraulic system. The degate punchers both pass through spaced apart circular holes in side rails of the lead frame strip to push through the cull runner to sever (detach) the cull runner from the encapsulated IC device. Tilting then allows the cull runners to be deposited in a cull bin. However, because the mold tends to adhere to all surfaces of the lead frame strip, the removal of the cull runner during punch degating can twist the lead frame strip that can be flexible enough to cause damage such bow or warp to the surrounding lead frame surface thereof.

SUMMARY

Disclosed embodiments recognize that degating processes involving degate punchers that pass through holes in side rails of the lead frame strip to remove the cull runners can result in problems for the packaged IC devices, particularly when the mold compound has strong adhesion to the lead frame surface in the degating regions (e.g., for mold compounds designed for zero delamination products). For example, if the adhesion between the lead frame strip surface and the mold compound is sufficiently strong in the degating regions, it can become necessary to manually remove the lead frame strip from the degater assembly.

In more common less extreme cases, the adhesion between the lead frame strip and the mold compound in the degating regions can be sufficiently high to delay the removal of the cull runner during punching by the punch apparatus which can cause bending or twisting of the lead frame strip which can lead to permanent warpage to the side rails of the lead frame. Warpage of the lead frame is known to cause problems when assembling the packaged semiconductor devices to a workpiece, such as to a printed circuit board (PCB) or an integrated circuit (IC) or a stack of ICs.

Disclosed embodiments include lead frame strip that provide punch degating apertures formed in the side rails of the lead frame strip which significantly reduce the contact area in the degating regions between the mold compound and the lead frame strip as compared to conventional circular first and second apertures. One disclosed embodiment comprises a lead frame strip that includes an array of sites. Each site includes a die pad having a die pad length along a first direction and a die pad width along a second direction for affixing a semiconductor die, and leads for enabling electrical communication between the semiconductor die and a workpiece. Each site is further connected to the two exterior side rails by subrails which extend between the two exterior side rails. Interior side rails extend between the subrails that have a length dimension oriented along the first direction.

The interior side rails include at least one punch degating aperture having an aperture length oriented along the first direction. The punch degating aperture is adapted for a degate puncher apparatus comprising at least one degate puncher to push through to sever a cull runner from mold material including mold material encapsulating the semiconductor die (the molded semiconductor package) after molding. The total aperture length of disclosed punch degating aperture(s) along the side rails is greater than or equal to die pad length. In contrast, in the case of conventional circular first and second punch degating apertures for degating, the total aperture length (length of the first and second apertures) is only a small fraction (e.g., 10 to 20%) of the die pad length.

Having a total aperture length greater than or equal to die pad length has been found by the Inventors to reduce the contact area in the degating region sufficiently to reduce or eliminate degating induced warpage, even for mold compounds designed for zero delamination products.

BRIEF DESCRIPTION OF THE DRAWINGS

FIG. 3A is a side view depiction during punch degating depiction during punch degating for two adjacent molded packages showing the degating regions that define the contact area for removing the cull runner from the known lead frame strip having circular punch degating apertures depicted in FIG. 1A.

FIG. 3B is a depiction during punch degating during punch degating for two adjacent molded packages showing the degating region that defines the contact area for removing the cull runner from the lead frame strip depicted in FIG. 1B, according to an example embodiment.

FIG. 4A shows a top view depiction of a portion of the lead frame strip shown in FIG. 1B after injection molding to form molded packages having attached cull runners, and before degating, while FIG. 4B shows a back view depiction of the same portion of the lead frame strip before degating.

DETAILED DESCRIPTION

Figure 1A:
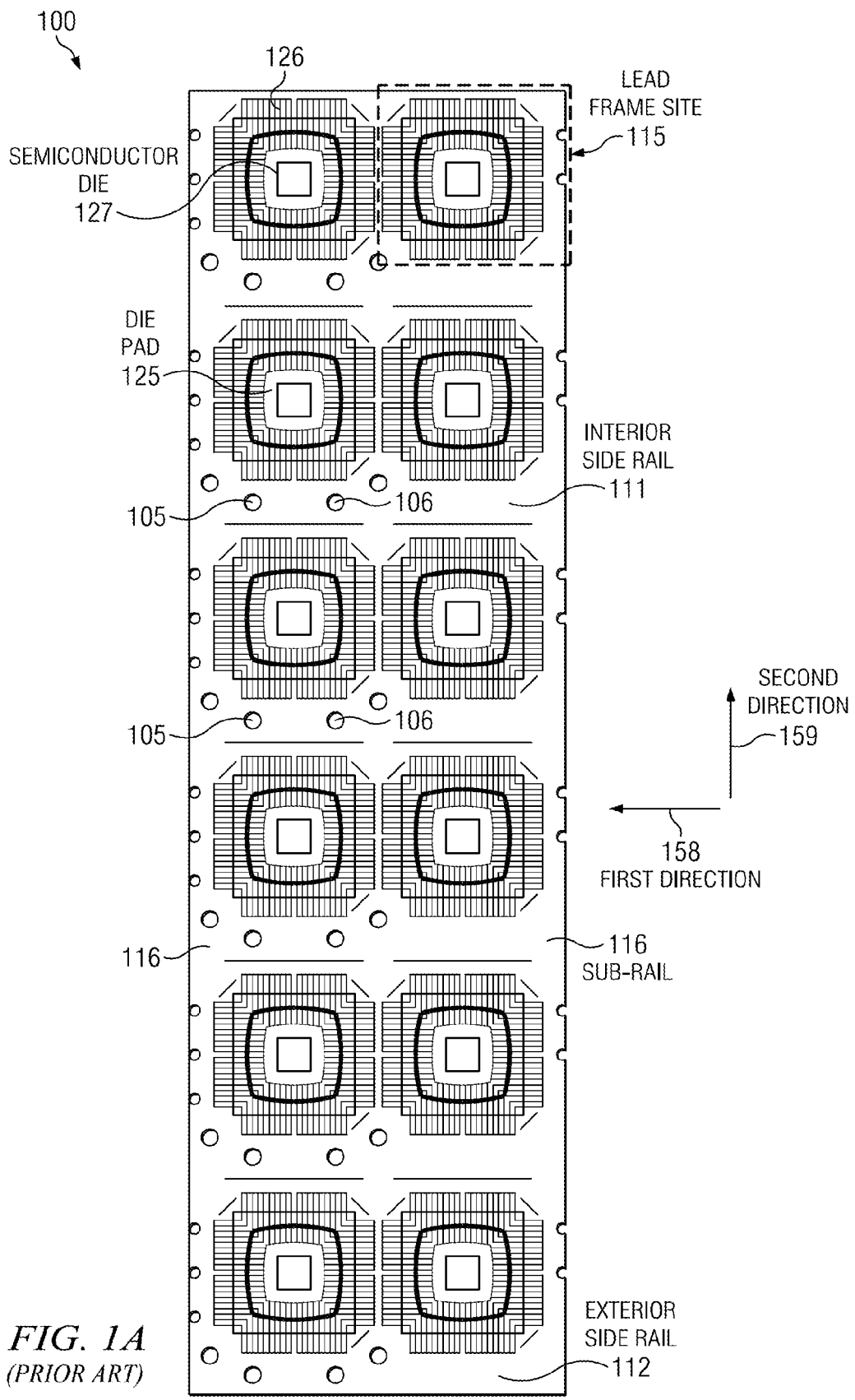
FIG. 1A is a top perspective depiction of a semiconductor assembly comprising a known lead frame strip including two rows of lead frames having conventional spaced apart circular punch degating apertures in the side rails, with a semiconductor die attached to each of the die pads.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1A is a top perspective depiction of a semiconductor assembly comprising a known lead frame strip 100 including two rows of lead frame sites 115 having circular punch degating apertures 105 and 106 in the interior side rails 111 and exterior side rails 112. Interior side rails 111 extend between the subrails 116 that have a length dimension oriented along a first direction 158, which is perpendicular to second direction 159. Sub-rails 116 connect exterior side rails 112. Lead frame sites 115 comprise die pads 125 and a plurality of leads 126 associated with each die pad 125. A semiconductor die 127 is attached (e.g., by a die attach material) to each of the die pads 125. The total aperture length of the sum of the punch degating apertures 105 and 106 along the first direction 158 can be seen to be considerably less than the length of the die pad 125 in the first direction 158.

Figure 1B:
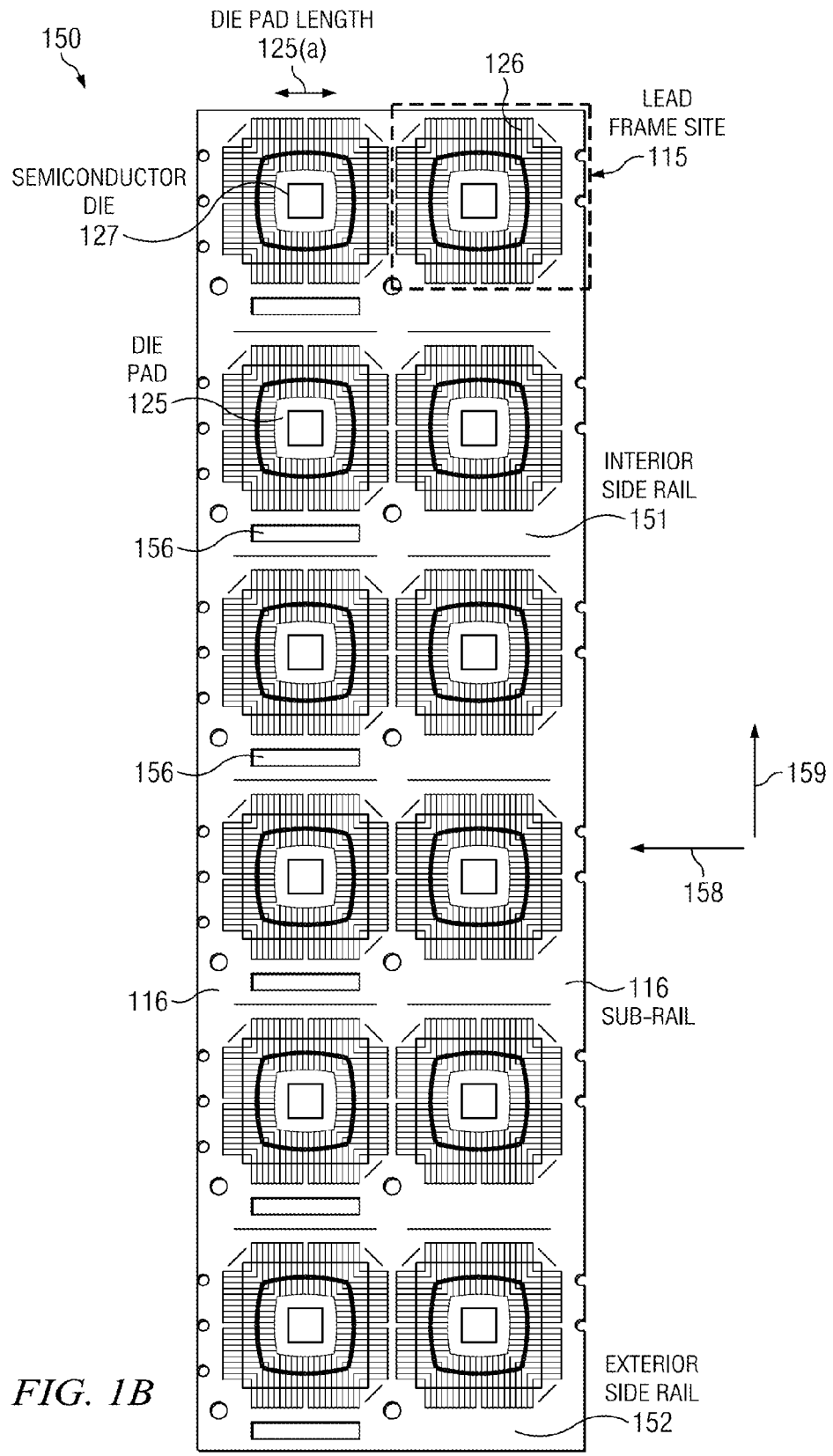
FIG. 1B is a top perspective depiction of an example semiconductor assembly comprising a lead frame strip including two rows of lead frames having punch degating apertures in the side rails that have an aperture length greater than or equal to the die pad length shown as rectangular shaped punch degating apertures, with a semiconductor die attached to each of the die pads, according to an example embodiment.

FIG. 1B is a top perspective depiction of an example semiconductor assembly comprising a lead frame strip 150 including two rows of lead frame sites 115 having punch degating apertures 156 in the interior side rails 151 and exterior side rails 152. The punch degating apertures 156 are shown as rectangular punch degating apertures. Rectangular shaped punch degating apertures is one example of punch degating apertures that provide an aperture length that is at least twice their width.

The aperture length of the punch degating aperture 156 along the first direction 158 can be seen to be greater than or equal to the length of the die pad 125 shown as die pad length (125(a)). Although a leaded lead frame 115 is shown, disclosed embodiment also apply to leadless lead frames, such as quad flat no-lead (QFN) lead frames. A semiconductor die 127 is shown attached (e.g., by a die attach material) to each of the die pads 125.

Although two (2) rows of lead frames 115 are shown in FIG. 1B, disclosed lead frame strips can comprise a single row of lead frames, or comprise 3 or more rows. Lead frames strips with more than 1 row of lead frames having conventional circular punch degating apertures have been found to tend to be prone to cull runner sticking during degating, which can cause bow or warpage of the lead frame strip, particularly for high adhesion mold compositions.

Figure 1C:
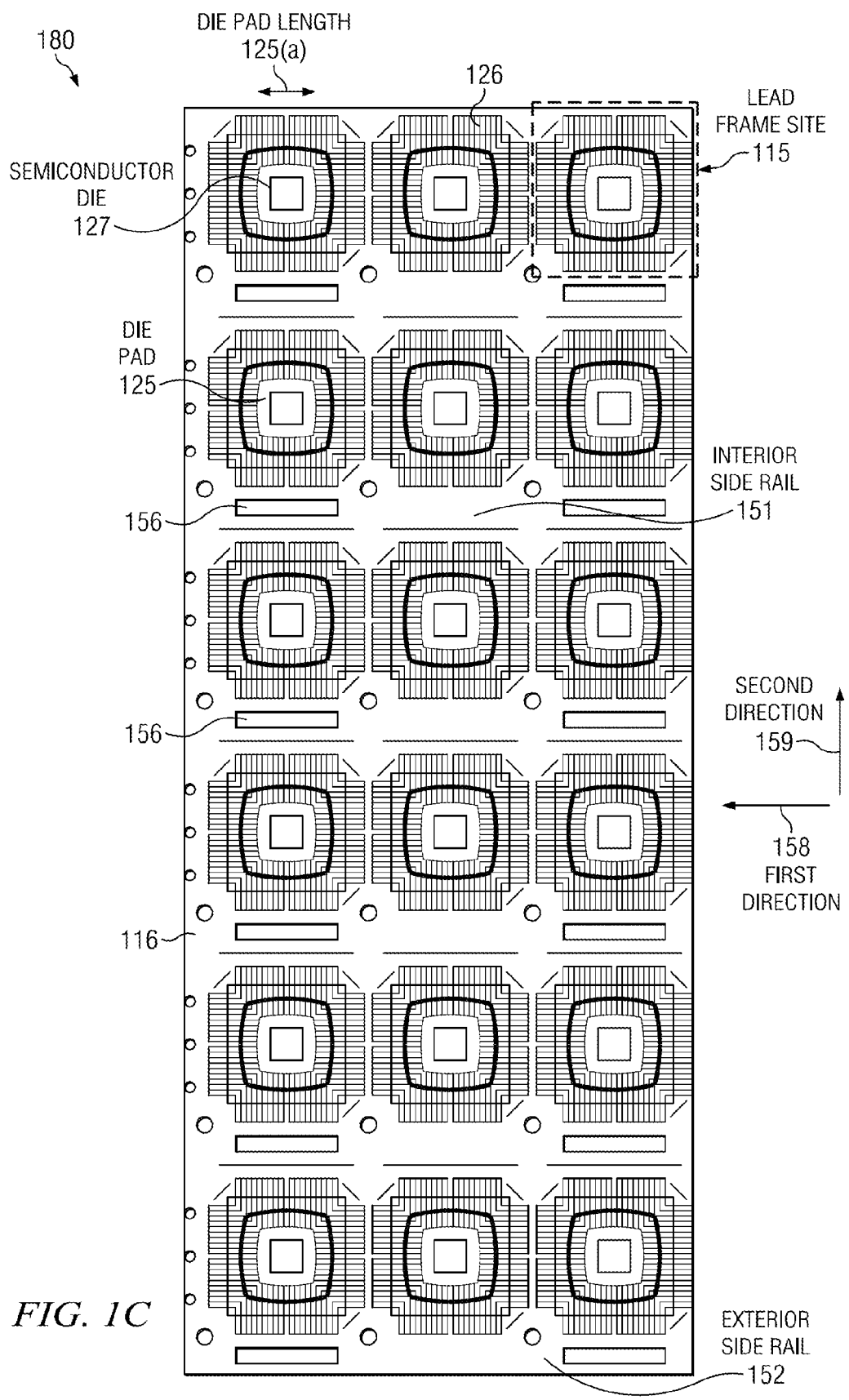
FIG. 1C is a top perspective depiction of an example lead frame strip including three rows of lead frames sites having disclosed punch degating apertures in the side rails for lead frame sites in the two outside rows.

For example, FIG. 1C is a top perspective depiction of an example lead frame strip 180 including three rows of lead frame sites 115 having punch degating apertures 156 in the interior side rails 151 and exterior side rails 152 for lead frame sites 115 in both outside rows. The total aperture length of the punch degating apertures 156 along the first direction 158 in the case of lead frame strip having two or more punch degating apertures along the interior side rails 151 or exterior side rail 152 is the sum of the lengths of the respective punch degating apertures. In another embodiment (not shown), punch degating apertures 156 are provided for lead frame sites 115 on the first row, second row, and third row, or more generally for all lead frame sites 115 on the lead frame strip for a lead frame strip having two or more rows.

Figure 2:
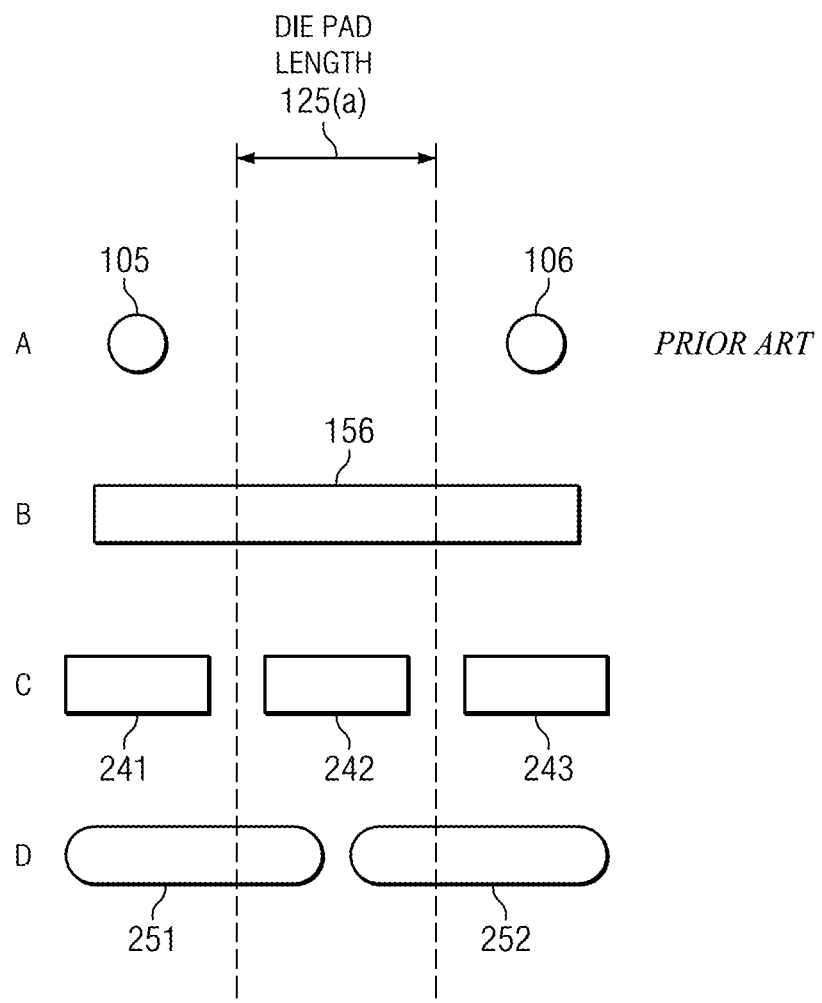
FIGS. 2A-D show depictions revealing sizes of punch degating aperture arrangements relative an example die pad length and their shapes including the conventional spaced apart circular punch degating apertures shown in FIG. 1A, the rectangular punch degating apertures shown in FIG. 1B, and first and second alternate embodiments of disclosed punch degating aperture arrangements, respectively.

FIGS. 2A-D show depictions revealing sizes of punch degating aperture arrangements relative an example die pad length and their shapes including the conventional spaced apart circular punch degating apertures 105 and 106 shown in FIG. 1A, the rectangular punch degating apertures 156 shown in FIG. 1B, and first and second alternate embodiments of disclosed punch degating aperture arrangements, respectively. As shown in FIG. 2C, the punch degating aperture arrangement comprises three (3) spaced apart rectangular apertures 241, 242, and 243. As shown in FIG. 2D, the punch degating aperture arrangement comprises two (2) spaced apart elliptical shaped apertures 251, and 252.

FIG. 3A is a side view depiction 300 during punch degating for two adjacent molded packages showing the degating region that defines the contact area for degating for removing a cull runner from the known lead frame strip 100 having circular punch degating apertures 105 and 106 depicted in FIG. 1A. Mold material is shown as 223. Punch degaters are shown as 215. The contact area defined by the punch degating apertures in the degating regions 218 during degating can be estimated as an area that extends out a distance of 1 mm in all directions from the edges of the punch degating apertures 105 and 106 plus the area between the punch degating apertures 105 and 106, minus all areas within the degating region 218 where at least one of the interior side rail 111 and the mold runner are not present.

FIG. 3B is a depiction 350 during punch degating during punch degating for two adjacent molded packages showing the degating region that defines the contact area for degating for removing the cull runner from the lead frame strip 150 depicted in FIG. 1B, according to an example embodiment. The contact area within the degating regions 268 using the above definition for lead frame strip 150 is an area that extends out a distance of 1 mm in all directions from the edges of the punch degating apertures 156 minus the area that one or both the interior side rail 151 and the mold runner are not present during degating (i.e., since interior side rail 151 is not present in the full area of degating apertures 156, there is no contact area over the area of the punch degating apertures). The reduction in contact area provided by lead frame strip 150 as compared to conventional lead frame strip 100 can be seen to be significant, such as by a factor of four (4) or more. Because the contact area between the mold material and the lead frame strip 150 in the degating regions 268 is significantly reduced, degating induced warpage of the lead frame strip during degating can be reduced or eliminated.

FIG. 4A shows a top view depiction of a portion 150(a) of the lead frame strip 150 shown in FIG. 1B after injection molding to form molded packages 415 having attached cull runners, before degating. FIG. 4B shows a back view depiction of the portion 150(a) of the lead frame strip 150 shown in FIG. 4A. The rectangular punch degating apertures 156 shown in FIG. 4A are filled with mold material. The cull runners are shown as 420 including a mold runner portion 420(a) and gate region portions 420(b) as shown in FIG. 4B that connect to each molded package 415. The width of the cull runners 420 (set by the mold die of the mold apparatus used for molding) can be seen to be about the same width as the width of the rectangular punch degating apertures 156.

An example embodiment of the invention was tested for degating performance based on lead frame strip 150 (rectangular punch degating apertures) shown in FIG. 1B and compared to the performance of conventional lead frame strip 100 (circular punch degating apertures) shown in FIG. 1A. The thickness of the lead frame strips used were about 0.20 mm. The mold material used was G700LS mold compound (Sumitomo Corporation). No bending or deformation was measured on the side rails for the disclosed lead frame strip 150 after degating using a degating apparatus having the punch degaters 215 depicted in FIGS. 3A and 3B, while conventional lead frame strip 100 was found to significantly deform/warp on the order of several mms on the side rails. As noted above, warpage of the lead frame is known to cause problems when assembling packaged semiconductor devices to a workpiece, such as to a printed circuit board (PCB) or other workpieces.

Disclosed embodiments can be integrated into a variety of assembly flows to form a variety of different IC devices and related products. The IC assembly can comprise single IC die or multiple IC die, such as PoP configurations comprising a plurality of stacked IC die. A variety of package substrates may be used. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. A lead frame strip, comprising:
   an array of sites arranged in at least one row connected to two exterior side rails which traverse said lead frame strip on two opposite sides;
   wherein each of said sites includes a die pad having a die pad length along a first direction and a die pad width along a second direction or affixing a semiconductor die and leads for enabling electrical communication between said semiconductor die and a workpiece;
   wherein each of said sites is further connected to said two exterior side rails by subrails which extend between said two exterior side rails, and
   interior side rails extending between said subrails having a length dimension oriented along a first direction,
   wherein said interior side rails include at least one punch degating aperture having an aperture length oriented along said first direction, and wherein a total of said aperture length along said interior side rails is greater than or equal to said die pad length.

2. The lead frame strip of claim 1, wherein said lead frame strip includes a plurality of said rows.

3. The lead frame strip of claim 1, wherein said interior side rails each include a plurality of said punch degating apertures.

4. The lead frame strip of claim 1, wherein said aperture length is at least twice a maximum width of said punch degating aperture.

5. The lead frame strip of claim 1, wherein said punch degating aperture is a rectangular shaped aperture and said aperture length of said rectangular shaped aperture is greater than or equal to said die pad length.

6. The lead frame strip of claim 1, wherein at least one of said two exterior side rails include said punch degating aperture.

7. A semiconductor assembly, comprising:
   a lead frame strip comprising an array of sites arranged in at least one row connected to two exterior side rails which traverse said lead frame strip on two opposite sides;
   wherein each of said sites includes a die pad having a die pad length along a first direction and a die pad width along a second direction having an affixed semiconductor die thereon and leads for enabling electrical communication between said semiconductor die and a workpiece;
   wherein each of said sites is further connected to said two exterior side rails by subrails which extend between said two exterior side rails, and
   interior side rails extending between said subrails having a length dimension oriented along first direction,
   wherein said interior side rails include at least one punch degating aperture having an aperture length oriented along said first direction, and wherein a total of said aperture length along said interior side rails is greater than or equal to said die pad length.

8. The semiconductor assembly claim 7, wherein said lead frame strip includes a plurality of said rows.

9. The semiconductor assembly claim 7, wherein said interior side rails each include a plurality of said punch degating apertures.

10. The semiconductor assembly of claim 7, wherein said aperture length is at least twice a maximum width of said punch degating aperture.

11. A degating method, comprising:
    providing a lead frame strip including an array of sites arranged in at least one row connected to two exterior side rails which traverse said lead frame strip on two opposite sides, wherein each of said sites includes a die pad having an affixed semiconductor die and leads for enabling electrical communication between said semiconductor die and a workpiece, and mold material comprising a cull runner connected to at least one molded semiconductor package each comprising said semiconductor die; wherein each of said sites is further connected to said two exterior side rails by subrails which extend between said two exterior side rails, and interior side rails extending between said subrails having a length dimension oriented along a first direction, wherein said interior side rails include at least one punch degating aperture having an aperture length oriented along said first direction, wherein a total of said aperture length along said interior side rails is greater than or equal to said die pad length, and
    pushing a degate puncher through said punch degating aperture to sever said cull runner from said molded semiconductor package.

12. The degating method of claim 11, wherein said aperture length is at least twice a maximum width of said punch degating aperture.

13. The degating method of claim 11, wherein said lead frame strip includes a plurality of said rows.

14. The degating method of claim 11, wherein said interior side rails each include a plurality of said punch degating apertures.

15. The degating method of claim 11, wherein said punch degating aperture is a rectangular shaped aperture and said aperture length of said rectangular shaped aperture is greater than or equal to said die pad length.

* * * * *